US007513500B2

(12) United States Patent
Itoh

(10) Patent No.: US 7,513,500 B2
(45) Date of Patent: Apr. 7, 2009

(54) IMAGE FORMING APPARATUS

(75) Inventor: Shinji Itoh, Osaka (JP)

(73) Assignee: Kyocera Mita Corporation (JP)

( * ) Notice: Subject to any disclaimer, the term of this patent is extended or adjusted under 35 U.S.C. 154(b) by 388 days.

(21) Appl. No.: 11/492,308

(22) Filed: Jul. 25, 2006

(65) Prior Publication Data

US 2007/0047999 A1 Mar. 1, 2007

(30) Foreign Application Priority Data

Aug. 30, 2005 (JP) ............................ 2005-249561

(51) Int. Cl.
*B65H 5/00* (2006.01)
*G03G 21/20* (2006.01)
*H05K 5/00* (2006.01)

(52) U.S. Cl. ........................... 271/264; 399/92; 399/93; 454/184; 454/186

(58) Field of Classification Search ................. 454/184, 454/186; 399/91, 92; 271/264, 10.09
See application file for complete search history.

(56) References Cited

U.S. PATENT DOCUMENTS 4,178,092 A * 12/1979 Yamamoto et al. ............ 399/93
5,086,209 A * 2/1992 Kintz et al. ................. 219/216
6,552,898 B1 * 4/2003 Noble ......................... 361/687
6,618,248 B1 * 9/2003 Dalheimer .................. 361/687
7,209,353 B2 * 4/2007 Ammirata ................... 361/695
7,248,471 B2 * 7/2007 Wabiszczewicz ........... 361/694
7,386,247 B2 * 6/2008 Doi ............................. 399/93
2004/0096229 A1 5/2004 Yoshihara et al.
2005/0074255 A1 * 4/2005 Awaya ........................ 399/92
2007/0212104 A1 * 9/2007 Miyamoto et al. ............ 399/92

FOREIGN PATENT DOCUMENTS

JP 2004-093708 3/2004

* cited by examiner

*Primary Examiner*—David H Bollinger
(74) *Attorney, Agent, or Firm*—Gerald E. Hespos; Anthony J. Casella

(57) ABSTRACT

An image forming apparatus is provided which is capable of preventing the heat radiated from a high-voltage power source board from raising the temperature around the high-voltage power source board to a high temperature. A cooling fan is disposed opposite to the side of the high-voltage power source board where electronic components are disposed, as well as substantially in parallel with the high-voltage power source board; the cooling fan blows air upon the high-voltage power source board; and a heat-radiating component disposed on the high-voltage power source board, such as a transistor and a transformer, is located one-sidedly near the cooling fan, so that they can be efficiently cooled.

10 Claims, 5 Drawing Sheets

IMAGE FORMING APPARATUS

BACKGROUND OF THE INVENTION

1. Field of the Invention

The present invention relates to an image forming apparatus such as a copier and a printer, and in particular, an image forming apparatus in which a cooling mechanism is used which takes radiated heat out of a power source board.

2. Description of the Related Art

FIG. 5 shows the configuration of a conventional image forming apparatus. Reference numeral 100 denotes such an image forming apparatus, and herein, as an example, a digital multi-function machine is shown. In this image forming apparatus 100, when a copying operation is executes, in an image forming portion 2 inside of a main body 1, a photosensitive drum 4 which rotates clockwise (i.e., in the direction indicated by the arrow in the figure) is uniformly charged with electricity by a charging unit 3. Then, a laser beam from an exposure unit 8 (such as a laser scanning unit) based on original image data which is read by an image reading portion 5 forms an electrostatic latent image on the photosensitive drum 4. A development unit 7 allows a developer (hereinafter, referred to as the toner) to adhere to this electrostatic latent image, so that a toner image is formed. This development unit 7 is supplied with the toner from a toner container 6.

Toward the photosensitive drum 4 on which the toner image is formed as described above, sheet 9 is conveyed from a sheet feed mechanism 10 via a sheet feed roller 11, a sheet conveying path 12 and a registration roller pair 13 to the image forming portion 2. In this image forming portion 2, a transfer roller 14 transfers, to the sheet 9, the toner image formed on the surface of the photosensitive drum 4. The sheet 9 to which the toner image has been transferred is detached from the photosensitive drum 4. Then, it is conveyed to a fixation unit 15 to fix the toner image. The toner (i.e., residual toner) which remains on the surface of the photosensitive drum 4 after the toner image has been transferred to the sheet 9 is removed by a cleaning unit 16.

The sheet 9 which has passed through the fixation unit 15 is conveyed to a branching member 17, and in the branching member 17, its conveying direction is divided into several directions. If the image is formed only on one surface of the sheet 9, then with the image surface kept upward (which is called face-up), the sheet 9 passes through a side discharge-roller pair 18 and is discharged from a side outlet 25 onto a sheet discharge tray 19. Or, it is sorted to a sheet conveying path 20 by the branching member 17 and passes through a conveying roller pair 21. By a inner discharge-roller pair 22, it is discharged onto a inner discharge tray 23 with the image surface turned downward (which is called face-down). The sheet conveying path 20, the conveying roller pair 21 and the inner discharge-roller pair 22 also function as a switchback unit which changes the sheet 9's conveying direction.

On the other hand, if the image is formed on both surfaces of the sheet 9, the sheet 9 which has passed through the fixation unit 15 is allocated to the sheet conveying path 20 by the branching member 17. Then, after its rear-end part has passed through the branching member 17, the conveying roller pair 21 and the inner discharge-roller pair 22 are reversely rotated to change the conveying direction. Thereafter, in the branching member 17, the sheet 9 is sorted to a duplex printing path 24 this time. Thus, the surface on which the image is not formed is turned upward and conveyed again to the image forming portion 2. On the sheet 9 conveyed again, the next image is formed in the image forming portion 2. Then, it is conveyed to the fixation unit 15 to fix the toner image. Thereafter, it is discharged outside of the apparatus from the side discharge-roller pair 18 or the inner discharge-roller pair 22.

In addition, an electric-charge elimination unit (not shown) which eliminates a residual electric charge remaining on the surface of the photosensitive drum 4 is provided on the downstream side of the cleaning unit 16. Besides, the sheet feed mechanism 10 is fit to the main body 1 so that it can be freely attached and detached. It is made up of a plurality of sheet feed cassettes 10*a*, 10*b*, 10*c* which store sheets, and a by-pass stack (or a manual tray) 10*d* which is provided above them. These are connected via the sheet conveying path 12 to the image forming portion 2 which is formed by the photosensitive drum 4, the development unit 7 and the like.

In the image forming apparatus 100 like this, a high-voltage power source board 26 for applying a high voltage to each component for the formation of an image, for example, as shown in FIG. 5, is opposite to the image forming portion 2 so as to cross a partition member (not shown) which is a part of the sheet conveying path 12. In the high-voltage power source board, there is disposed a heat-radiating component (not shown) such as a transformer. Hence, such a heat-radiating component needs to be cooled. In this respect, conventionally, for example, Japanese Patent Laid-Open No. 2004-93708 specification suggests a cooling mechanism which cools a heat-radiating component disposed on such a power source board. As this cooling mechanism, an air outlet is formed in the surface of a side plate of a body frame, and in the position of this air outlet, a cooling fan is provided which discharges the air heated up by the heat generated from components which radiate a large quantity of heat.

However, if such a cooling fan is provided in the body frame's side plate, a disadvantage arises in that an image forming apparatus becomes larger. Besides, if the cooling fan is disposed in the side plate, the distance becomes longer between the cooling fan and a heat-radiating component to be cooled on a high-voltage power source board. This makes it difficult to form an air-flow path or do another such. Hence, another disadvantage is also raised in that it cannot be efficiently cooled.

SUMMARY OF THE INVENTION

It is an object of the present invention to provide an image forming apparatus which is capable of efficiently cooling a power source board provided inside of the image forming apparatus, without making the apparatus larger.

An image forming apparatus according to an aspect of the present invention, comprising: a sheet feed cassette; an image forming portion which forms an image on sheet supplied from the sheet feed cassette and conveyed through a sheet conveying path; a partition member which forms the sheet conveying path; a power source board which faces the image forming portion across the partition member; and a cooling fan which cools the power source board, wherein the cooling fan is disposed between the sheet feed cassette and the power source board as well as substantially in parallel with the power source board.

In this image forming apparatus, the cooling fan is disposed between the sheet feed cassette and the power source board as well as substantially in parallel with the power source board. This makes it possible to efficiently cool the power source board provided inside of the image forming apparatus, without making the apparatus larger. In addition, compared with the case where the cooling fan is provided in a side plate of a body frame, there is no need to make the apparatus larger.

These and other objects, features and advantages of the present invention will become more apparent upon reading of the following detailed description along with the accompanied drawings.

DETAILED DESCRIPTION OF THE PREFERRED EMBODIMENTS

Figure 1:
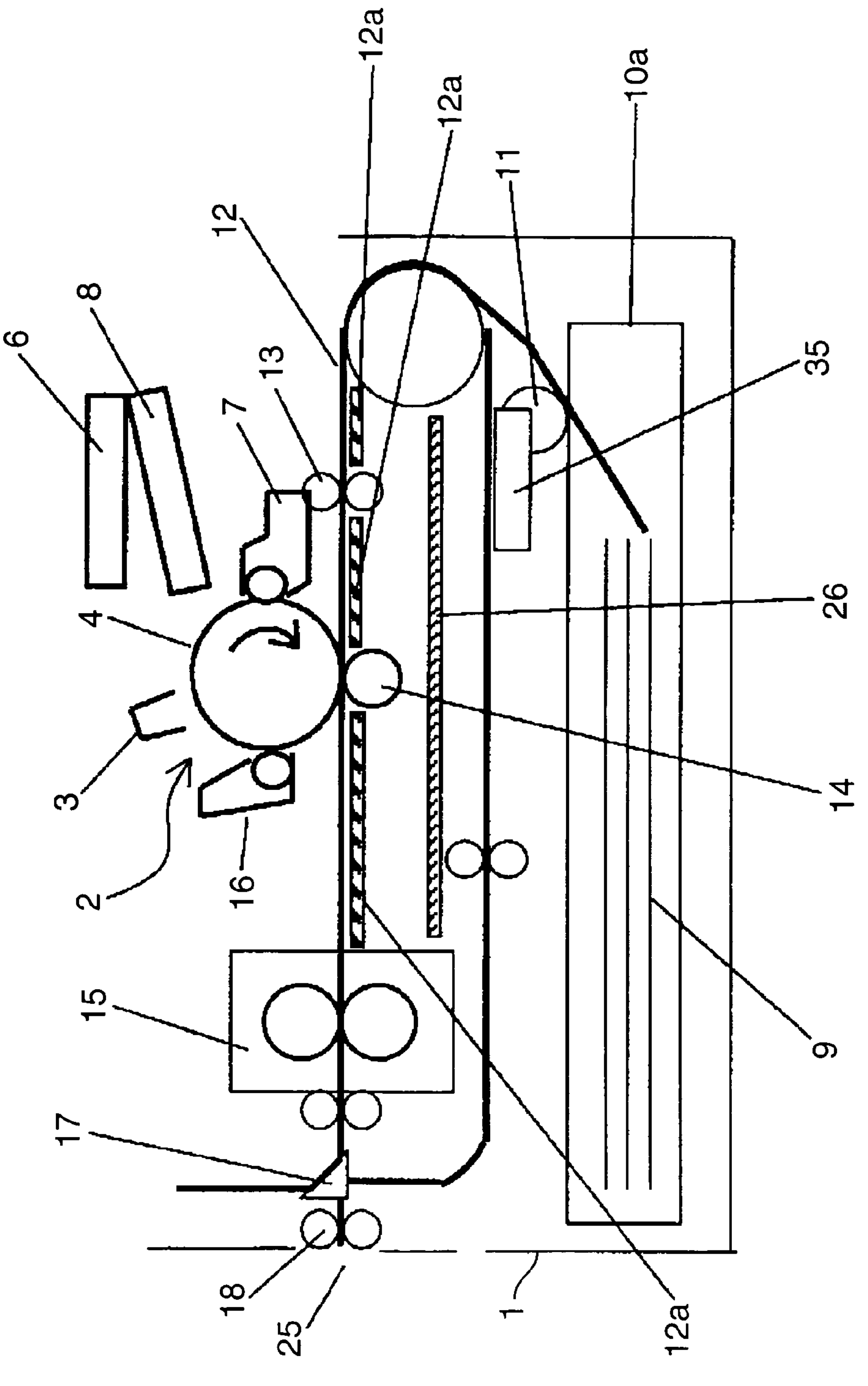
FIG. 1 is a schematic sectional view of an image forming apparatus according to an embodiment of the present invention, showing the relation between a high-voltage power source board and an image forming portion.

Hereinafter, an image forming apparatus according to an embodiment of the present invention will be described with reference to the attached drawings. The image forming apparatus according to this embodiment is a digital multi-function machine, and its basic configuration is the same as that of the image forming apparatus 100 according to a prior art shown in FIG. 5. Hence, component elements common to those according to the prior art are given the same reference numerals and characters, and their description is omitted unless especially necessary.

FIG. 1 is a schematic sectional view of the image forming apparatus according to this embodiment, showing the relation between a high-voltage power source board 26 and an image forming portion 2. This figure aims at describing the disposition of the high-voltage power source board 26 in the image forming apparatus. In FIG. 1, a partition member 12*a* is a resin member which is also called a conveying frame. It is a member which also functions as a sheet conveying guide. The high-voltage power source board 26 faces the image forming portion 2 so that between both members, the partition member 12*a* is sandwiched.

Figure 2:
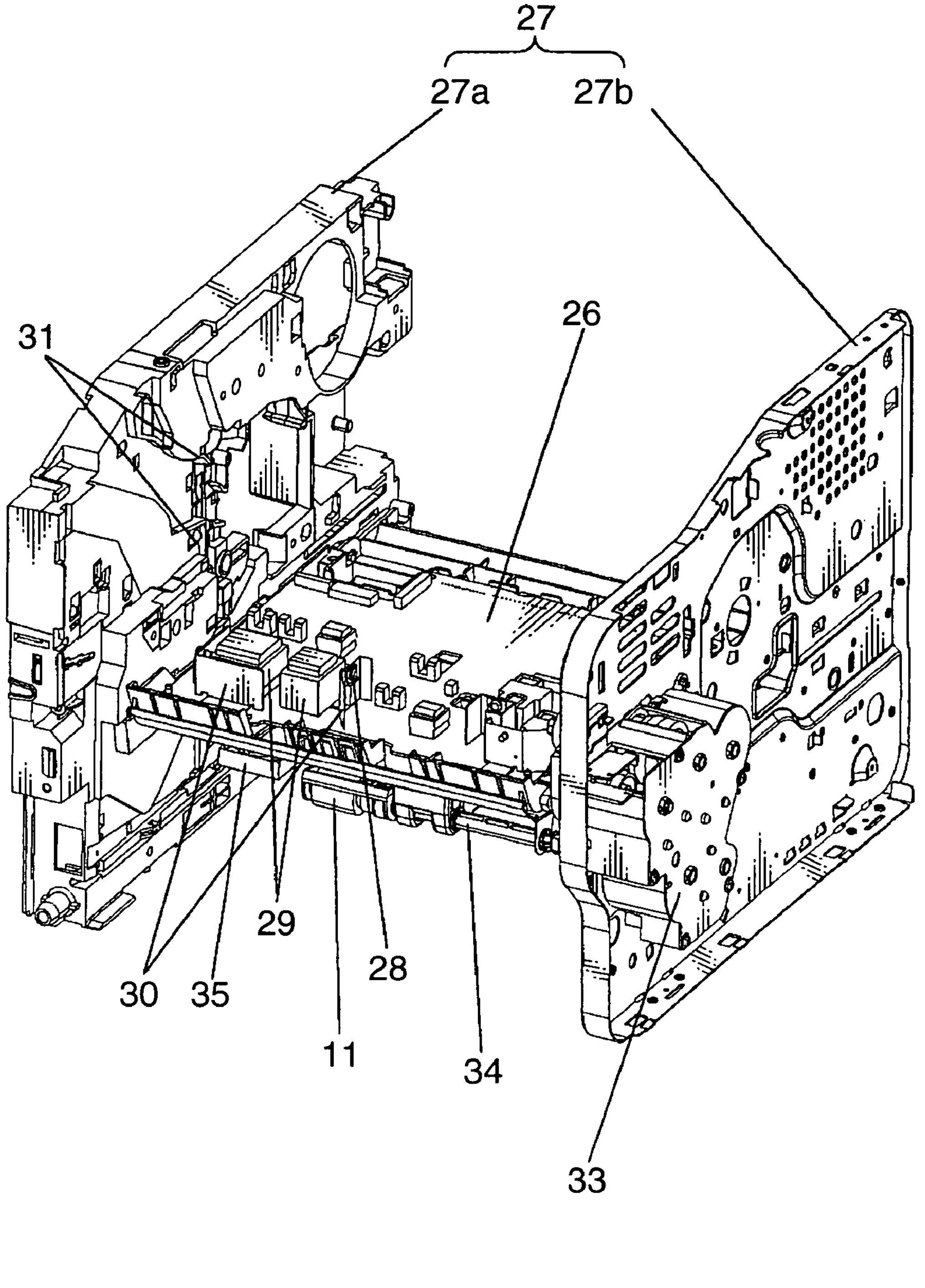
FIG. 2 is a schematic enlarged perspective view of the image forming apparatus according to the embodiment of the present invention, showing the configuration around the high-voltage power source board.

FIG. 2 is a schematic enlarged perspective view of the image forming apparatus according to this embodiment, showing the configuration around the high-voltage power source board 26. As shown in FIG. 2, the high-voltage power source board 26 is sandwiched between body frames 27 which are provided right and left. It is placed horizontally inside of a main body 1 (see FIG. 1). This high-voltage power source board 26 is a circuit board which is used for applying a high voltage to a charging unit 3, a photosensitive drum 4 (in terms of either of which, see FIG. 1) or the like when an image is formed.

The high-voltage power source board 26 is substantially a rectangle. On the upper surface of the high-voltage power source board 26, various electronic components are disposed which are necessary for the circuit configuration. Among these electronic components, particularly, a transistor 28 or a transformer 29 radiates a large quantity of heat. Thus, in the transistor 28 or the transformer 29, a heat sink (i.e., a radiation plate) 30 is provided for radiating heat. The heat sink 30 is each a substantially-rectangular plate body. Its edge part in one direction, or both edge parts, are bent substantially perpendicular to its plate surface, so that it has an L-shape or a U-shape in its sectional view.

In a portion 27*a* of the body frame 27 on the left side of FIG. 2, a high-voltage contact point 31 is provided which is connected to the high-voltage power source board 26. It supplies power to each kind of part which is used when an image is formed, such as the charging unit 3 and the photosensitive drum 4. In this embodiment, as the high-voltage contact point 31, two pieces are provided, but the number of high-voltage contact points is not limited to this. According to what it is used for, one, three, or more high-voltage contact points may also be provided.

On the other hand, in a portion 27*b* of the body frame 27 on the right side of FIG. 2, a drive unit 33 is provided. It drives a sheet feed roller 11 which can feed a sheet 9 (see FIG. 1) stored in a sheet feed cassette 10*a* (see FIG. 1). The sheet feed roller 11 is connected to the drive unit 33, via a sheet feed roller drive mechanism 34 formed by a shaft and the like. In the image forming apparatus according to this embodiment, only one piece is provided as the sheet feed cassette 10*a*, different from the case according to the prior art shown in FIG. 5. However, in the same way as the prior art, several feed cassettes may also be provided.

As shown in FIG. 2, in the high-voltage power source board 26, on its side opposite to the side where the electronic components are placed, a cooling fan 35 is provided. It works for preventing the heat emitted from the high-voltage power source board 26 from raising the temperature around the high-voltage power source board 26 to a high temperature. In order to do this, it is disposed substantially in parallel with the high-voltage power source board 26. In other words, the cooling fan 35 is disposed so that the direction in which it sends air is substantially vertical to the reverse surface of the high-voltage power source board 26. Besides, as shown in FIG. 2, the cooling fan 35 is on the left of the sheet feed roller 11 (i.e., on the side where the high-voltage contact point 31 is located). This left-hand side of the sheet feed roller 11 where the cooling fan 35 is placed is an empty space in the first place. Thus, if the cooling fan 35 is placed in this position, that is advantageous to the image forming apparatus whose size should be smaller. Hence, this configuration can be said to be desirable. However, the cooling fan 35's position not necessarily needs to be next to the sheet feed roller 11.

As described above, in this embodiment, the high-voltage contact point 31 is provided only in the portion 27*a* on the left side of the body frame 27. Thereby, heat-radiating components to be given a high voltage which are disposed on the high-voltage power source board 26, such as the transistor 28 and the transformer 29, can be easily placed near the left portion 27*a* including the high-voltage contact point 31.

Furthermore, in this embodiment, the cooling fan 35 is designed to blow air in the direction of the high-voltage power source board 26. Hence, if the heat-radiating components are located on the side where the cooling fan 35 sends air, the heat-radiating components can be efficiently cooled. Thus, preferably, it should be disposed in such a manner. Therefore, in this embodiment, the heat-radiating components, such as the transistor 28 and the transformer 29, are biased adjacent to the cooling fan 35.

Moreover, the heat-radiating components such as the transistor 28 and the transformer 29 may also be mounted on the reverse surface of the high-voltage power source board 26 (i.e., the surface of the high-voltage power source board 26 on the side of the cooling fan 35). In this case, the air from the cooling fan 35 is blown directly on the heat-radiating components such as the transistor 28 and the transformer 29. This helps enhance the cooling effect.

Figure 3:
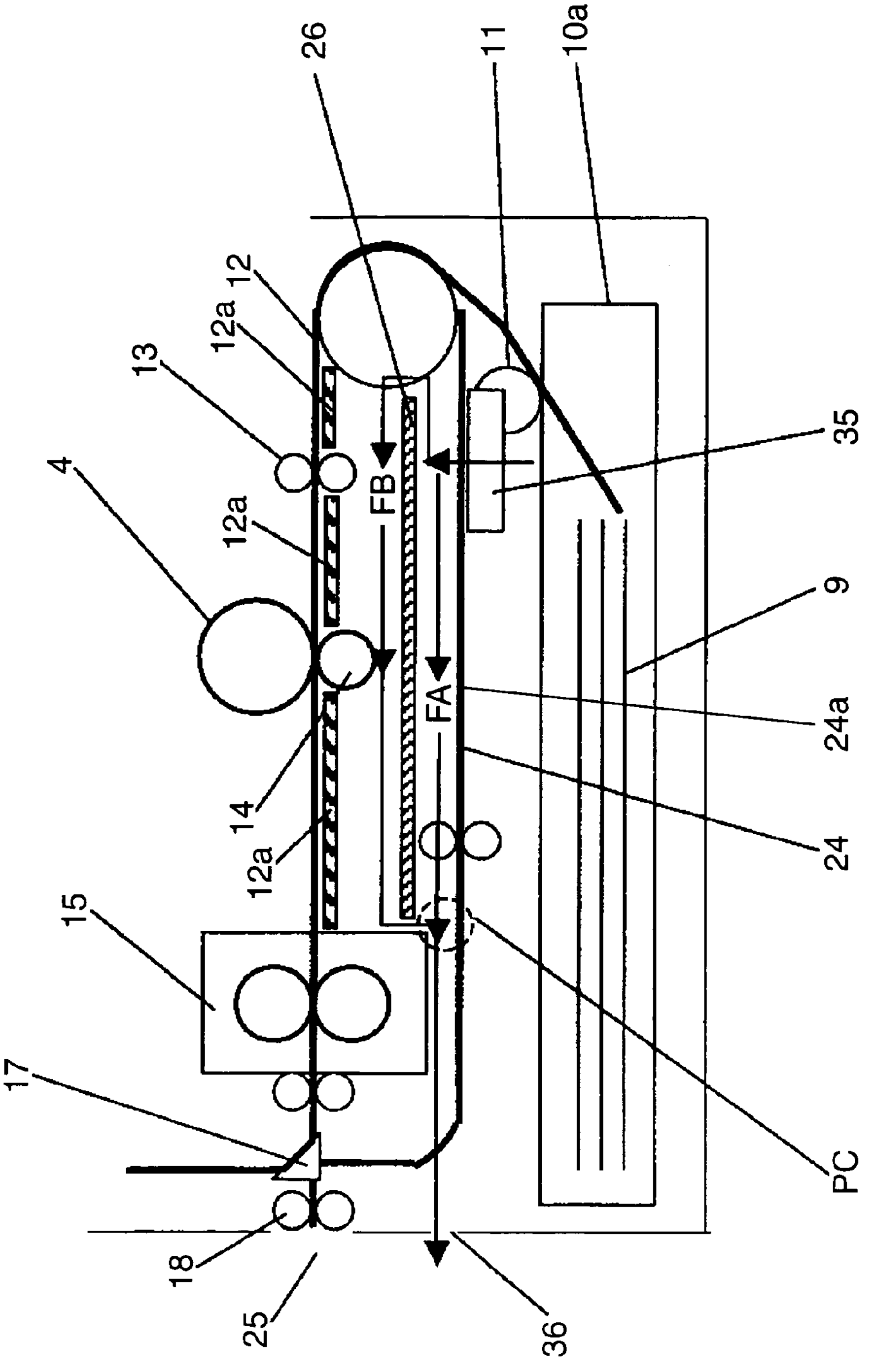
FIG. 3 is a schematic sectional view of the image forming apparatus according to the embodiment of the present invention, showing the flow of air around the high-voltage power source board when a cooling fan operates.

FIG. 3 is a schematic sectional view of the image forming apparatus, showing the flow of air around the high-voltage power source board 26 when the cooling fan 35 operates. Particularly, it shows the high-voltage power source board 26 and its vicinity. In FIG. 3, the electronic components provided on the high-voltage power source board 26 are omitted for convenience.

The cooling fan 35 is designed to suck in air from the outside of the image forming apparatus and blow it upon the high-voltage power source board 26. However, the air blown on the high-voltage power source board 26 branches, as shown by the arrows of FIG. 3, into the air (i.e., the air shown by an arrow FA in FIG. 3) which flows under the high-voltage power source board 26 and the air (i.e., the air shown by an arrow FB in FIG. 3) which flows over the high-voltage power source board 26 where the electronic components such as the transistor 28 and the transformer 29 are disposed. Specifically, the air sent to the side of the high-voltage power source board 26 from the cooling fan 35 is blown on the high-voltage power source board 26. Thereby, it cools the high-voltage power source board 26 itself. At the same time, it is also blown upon the heat-radiating components such as the transistor 28, so that it has the function of cooling the heat-radiating components itself as well.

The air which flows over and under the high-voltage power source board 26 cools the high-voltage power source board 26 or the heat-radiating components, and thereby, it is heated. Thus, the heated air needs to be emitted outside of the image forming apparatus. In this respect, in this embodiment, the air heated after flowing over the high-voltage power source board 26 and the air heated after flowing under it join at a part PC shown by a broken-line circle in FIG. 3. Then, the air is discharged from a blowing outlet 36 to the outside of the image forming apparatus. Incidentally, the blowing outlet 36's position is not limited to the position shown in this embodiment. Any position may be chosen, as long as the air heated after passing over and under the high-voltage power source board 26 can be efficiently discharged. Besides, in order to facilitate the supply of the air shown by the arrow FB of FIG. 3, in the part of the high-voltage power source board 26 which faces the cooling fan 35, an opening portion may also be formed, such as a notch, a slit and a through hole.

In this embodiment, as shown in FIG. 3, between the cooling fan 35 and the high-voltage power source board 26, a guide member 24*a* is provided which forms a part of a duplex printing path 24 used when duplex printing is executed. In this guide member 24*a*, a slit-shaped air vent (not shown) is formed so that the air sent by the cooling fan 35 can be sent to the high-voltage power source board 26. Needless to say, the shape of the air vent is not limited to the shape of a slit, and thus, various shapes can be used.

In addition, in this embodiment, the cooling fan 35 is designed to be located above the sheet feed cassette 10*a* and blow air to the side of the high-voltage power source board 26. In this case, if the air sent by the cooling fan 35 is moist, the sheet 9 stored in the sheet feed cassette 10*a* may absorb some of the moisture, thus hindering the formation of an image. Hence, when air is sent to the cooling fan 35 from the outside of the image forming apparatus, in order to prevent the sheet 9 stored in the sheet feed cassette 10*a* from being exposed to the moist air, preferably, the cooling fan 35 should be connected to a duct which leads to the outside of the image forming apparatus.

Figure 4:
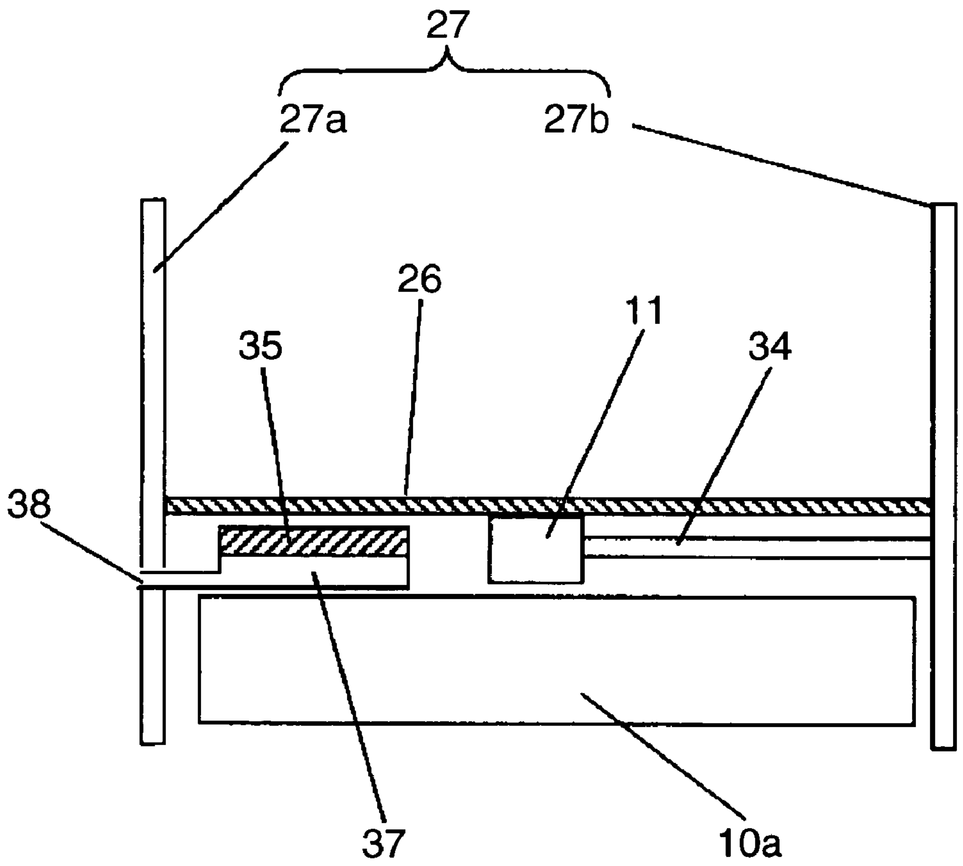
FIG. 4 is a schematic sectional view of the image forming apparatus according to the embodiment of the present invention, showing the configuration of the cooling fan and a duct in communication with it.

FIG. 4 is a schematic sectional view of the image forming apparatus, seen from the right of FIG. 3, showing the configuration of the connection of the cooling fan 35 to a duct. As shown in FIG. 4, a duct 37 leads to the outside of the image forming apparatus, through an air vent 38 which is formed in the portion 27*a* on the left side of the body frame 27. According to this configuration, the air which passes through the duct 37 can be prevented from coming into contact with the sheet 9 placed in the sheet feed cassette 10*a*. This keeps the sheet 9 from absorbing some of its moisture. Incidentally, how to arrange the duct 37 and the air vent 38 is not limited to the configuration of this embodiment.

In the embodiment described so far, the cooling fan 35 sucks in air from the outside of the image forming apparatus and blows this air on the high-voltage power source board 26. However, the present invention is not limited to this. Specifically, the cooling fan 35 may also be designed to suck out the air which is sent in from the outside of the image forming apparatus, toward the part where the high-voltage power source board 26 is located. In this case, the air sucked out from the cooling fan 35 is heated by the heat emitted from the heat-radiating components. Therefore, if the cooling fan 35 is designed to be located above the sheet feed cassette 10*a* and blow the air on the sheet feed cassette 10*a*, the sheet 9 inside of the sheet feed cassette 10*a* can be dried.

Furthermore, in this embodiment, a description is given about the cooling of the high-voltage power source board 26. However, a heat-radiating component can be placed in another power source board located between the sheet feed cassette 10*a* and the image forming portion 2 (in terms of either of which, see FIG. 1). In that case alike, a cooling fan may also be provided using the same configuration as that of this embodiment, so that such a power source board can be cooled. Moreover, this embodiment shows the image forming apparatus which can print both sides of a paper. However, the present invention can be applied to a type of image forming apparatus which is not supposed to print both sides of a paper.

Figure 5:
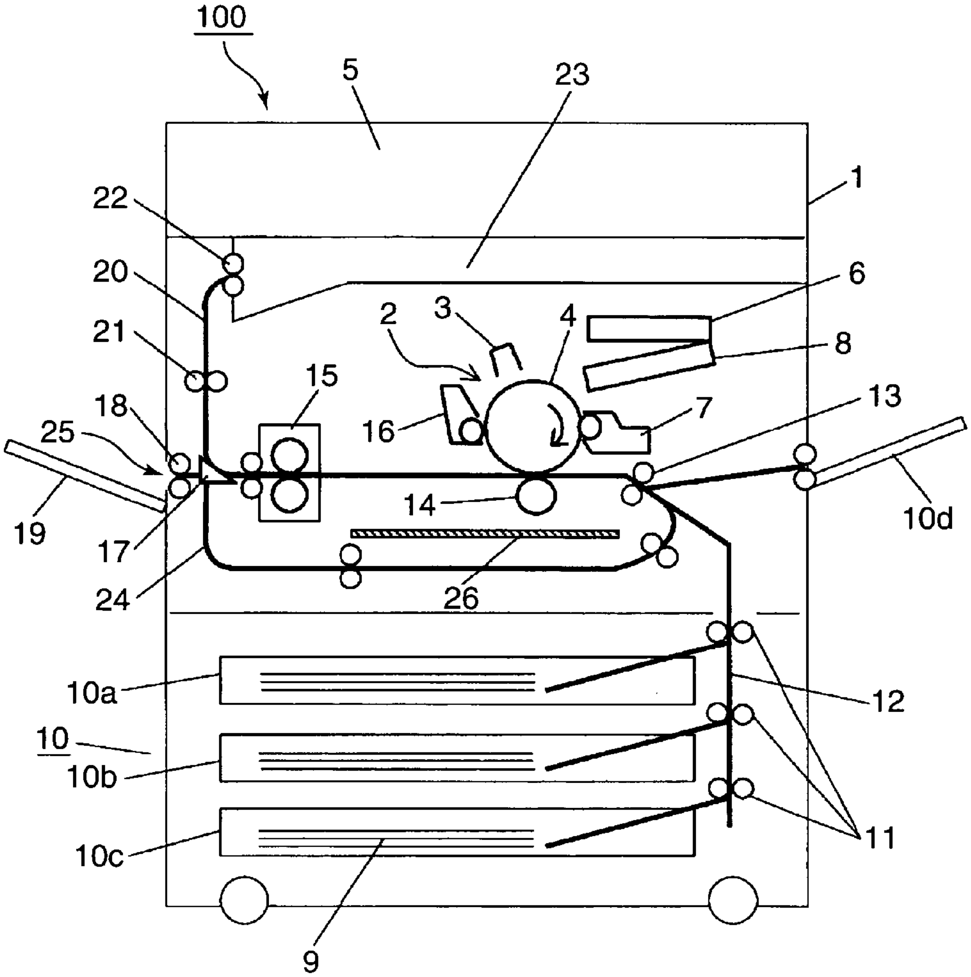
PRIOR ART FIG.5
FIG. 5 is a schematic sectional view of a conventional image forming apparatus, showing its whole configuration.

Besides, the present invention is not limited to such a digital multi-function machine as described in FIG. 5. As a matter of fact, it can also be applied to another type of image forming apparatus, such as a tandem-system color-image forming apparatus, an analog-system monochrome copier, a facsimile device and a laser printer.

As described earlier, the image forming apparatus according to the embodiment of the present invention, comprising: a sheet feed cassette; an image forming portion which forms an image on sheet fed from the sheet feed cassette and conveyed through a sheet conveying path; a partition member which forms the sheet conveying path; a power source board which faces the image forming portion across the partition member; and a cooling fan which cools the power source board, wherein the cooling fan is disposed between the sheet feed cassette and the power source board as well as substantially in parallel with the power source board.

In this image forming apparatus, the cooling fan can be placed near the power source board, thereby cooling the power source board more efficiently. In addition, the cooling fan is disposed substantially in parallel with the power source board. Therefore, the apparatus becomes smaller than that in the case where the cooling fan is provided in the side plate of the body frame.

It is preferable that a heat-radiating component disposed on the power source board be located one-sidedly near the cooling fan.

In this case, a heat-radiating component is biased and disposed near the position in which the cooling fan is provided.

This makes it possible to enhance the efficiency at which the power source board can be cooled.

Preferably, in the above described image forming apparatus: a duct should be further provided which leads between the cooling fan and an air vent formed in a side surface of the body of the image forming apparatus; and air should be sent through the duct into the cooling fan.

In this case, through the duct which leads to an air vent of a side surface of the body of the image forming apparatus, air is sent into the cooling fan. Therefore, the sheet stored in the sheet feed cassette can be prevented from being affected by the air which flows when the cooling fan is in operation. Hence, if the cooling fan sucks in air from the outside of the image forming apparatus and blows this air on the power source board, the sheet can be prevented from absorbing moisture from the moist air.

It is preferable that the power source board be a high-voltage power source board for applying a high voltage to the image forming portion when an image is formed.

In this case, the high-voltage power source board where many components which radiate a large quantity of heat are disposed can be efficiently cooled.

Preferably: a sheet feed roller should be further provided which feeds a sheet stored in the sheet feed cassette; in one of two body frames which stand upright so as to sandwich the high-voltage power source board, a drive unit which drives the sheet feed roller should be provided, and in the other, a high-voltage contact point connected to the high-voltage power source board should be provided; and the cooling fan should be adjacent to the sheet feed roller on the side of the high-voltage contact point.

In this case, in the space formed by the high-voltage power source board and the two body frames, the sheet feed roller can be placed on the side of the drive unit while the cooling fan can be placed on the side of the high-voltage contact point. This makes it possible to efficiently dispose the cooling fan in the limited space, thus making the apparatus smaller.

It is preferable that the cooling fan blow, upon the sheet feed cassette, the air which is sucked out from around the high-voltage power source board.

In this case, the air sucked out from the cooling fan is heated by the heat emitted from the heat-radiating components attached to the high-voltage power source board. Then, this heated air is blown on the sheet feed cassette. Therefore, the sheet stored in the sheet feed cassette can be dried.

Preferably, in the above described image forming apparatus: a guide member should be further provided which is disposed between the cooling fan and the power source board and forms a duplex printing path for conveying sheet when both sides of the sheet are printed; and the guide member should include an air vent which the air sent by the cooling fan passes through.

In this case, in the guide member which forms a part of a duplex printing path for conveying sheet when both sides of the sheet are printed, an air vent is formed which the air sent by the cooling fan passes through. Therefore, without lowering the cooling efficiency for the power source board, both sides of the sheet can be printed.

It is preferable that: the cooling fan be biased on one side of the power source board; the air sent by the cooling fan include first air which flows along one surface of the power source board, and second air which flows along the other surface thereof; and a blowing outlet be formed ahead of the point at which the first air and the second air flow into each other.

In this case, the first air sent from the cooling fan is blown upon the power source board, so that the power source board itself can be cooled. Simultaneously, the second air sent from the cooling fan is also blown upon the heat-radiating components attached to the other surface of the power source board. Thereby, the heat-radiating components can also be cooled. Besides, the cooling fan is disposed to be biased toward one side of the power source board, and a blowing outlet is formed ahead of the point at which the first air and the second air flow into each other. This allows the air sent in from the cooling fan to flow in a straight line from the side of the cooling fan to the side of the blowing outlet. As a result, an efficient air flow can be realized.

This application is based on Japanese patent application serial No. 2005-249561, filed in Japan Patent Office on Aug. 30, 2005, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An image forming apparatus, comprising:
- a sheet feed cassette;
- an image forming portion which forms an image on a sheet fed from the sheet feed cassette and conveyed through a sheet conveying path;
- a partition member which forms the sheet conveying path;
- a power source board which faces the image forming portion across the partition member; and
- a cooling fan which cools the power source board,
- wherein the cooling fan is disposed between the sheet feed cassette and the power source board as well as substantially in parallel with the power source board.

2. The image forming apparatus according to claim 1, wherein a heat-radiating component is disposed on the power source board and is located on a side of the power source board near the cooling fan.

3. The image forming apparatus according to claim 1, wherein:
- a duct is further provided which leads between the cooling fan and an air vent formed in a side surface of the body of the image forming apparatus; and
- air is sent through the duct into the cooling fan.

4. The image forming apparatus according to claim 1, wherein the power source board is a high-voltage power source board for applying a high voltage to the image forming portion when an image is formed.

5. The image forming apparatus according to claim 4, wherein:
- a sheet feed roller is further provided which feeds a sheet stored in the sheet feed cassette;
- in one of two body frames which stand upright so as to sandwich the high-voltage power source board, a drive unit which drives the sheet feed roller is provided, and in the other, a high-voltage contact point connected to the high-voltage power source board is provided; and
- the cooling fan is adjacent to the sheet feed roller on the side of the high-voltage contact point.

6. The image forming apparatus according to claim 4, wherein the cooling fan blows, on the sheet feed cassette, the air which is sucked out from around the high-voltage power source board.

7. The image forming apparatus according to claim 1, wherein:
- a guide member is further provided which is disposed between the cooling fan and the power source board and forms a duplex printing path for conveying a sheet when both sides of the sheet are printed; and the guide member includes an air vent which the air sent by the cooling fan passes through.

8. The image forming apparatus according to claim 1, wherein:

the power source board has opposite first and second side edges, the cooling fan is closer to the first side edge of the power source board than to the second side edge thereof;

the air sent by the cooling fan includes first air which flows along one surface of the power source board, and second air which flows along the other surface thereof; and a blowing outlet is formed ahead of the point at which the first air and the second air flow into each other.

9. The image forming apparatus according to claim 1, further comprising first and second opposed body frames, the power source board extending between the first and second body frames, the cooling fan being disposed closer to the first body frame than to the second body frame.

10. The image forming apparatus according to claim 9, further comprising at least one heat-radiating component disposed on the power source board at a position closer to the first body frame than to the second body frame and substantially aligned with the cooling fan on a surface of the power source board opposite the cooling fan.

* * * * *